(12) United States Patent
Onoma et al.

(10) Patent No.: US 6,239,406 B1
(45) Date of Patent: May 29, 2001

(54) LASER BEAM MACHINING APPARATUS

(75) Inventors: Yoshimi Onoma; Masato Edahiro, both of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/280,827

(22) Filed: Mar. 30, 1999

(30) Foreign Application Priority Data

Apr. 1, 1998 (JP) .................................................. 10-089091

(51) Int. Cl.⁷ .................................................. B23K 26/38
(52) U.S. Cl. .................................. 219/121.82; 219/121.7; 219/121.81; 700/166
(58) Field of Search ............................ 219/121.82, 121.7, 219/121.71, 121.61, 121.67, 121.8, 121.81; 700/166

(56) References Cited

U.S. PATENT DOCUMENTS 5,293,025 * 3/1994 Wang ............................... 219/121.71

FOREIGN PATENT DOCUMENTS

| 60-180687 | * 9/1985 | (JP) | ................................. 219/121.71 |
| 2-99285 | 4/1990 | (JP) . | |
| 8-206867 | 8/1996 | (JP) . | |
| 9-5385 | 1/1997 | (JP) . | |

* cited by examiner

*Primary Examiner*—Geoffrey S. Evans
(74) *Attorney, Agent, or Firm*—Sughrue, Mion, Zinn, Macpeak & Seas, PLLC

(57) ABSTRACT

A laser beam machining apparatus has machining apparatus including a laser oscillator, a stage for moving a workpiece in XY directions, and a central processing unit (CPU) for controlling laser emission of the laser oscillator and movement of the stage. The CPU causes the laser beam machining apparatus to group machining points on the workpiece into a plurality of segments, each segment being a set of machining points aligned parallel to one of the X axis and Y axis, to create a shortest route through the plurality of segments, to drive the stage along the shortest route, and to apply a laser beam on the machining points on the shortest route.

17 Claims, 6 Drawing Sheets

FIG.5
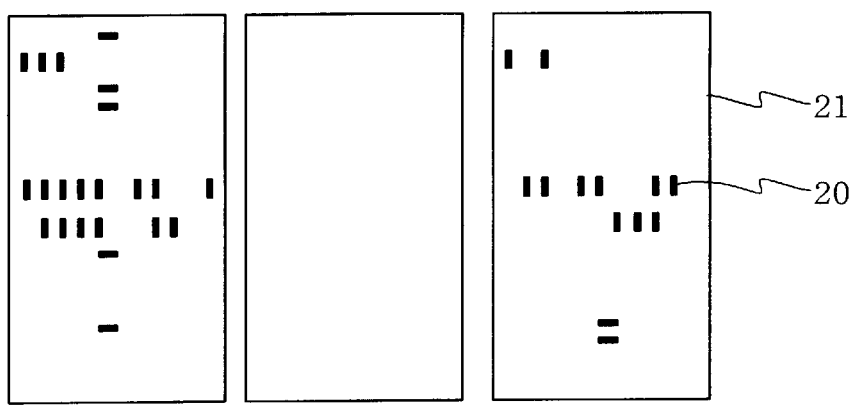
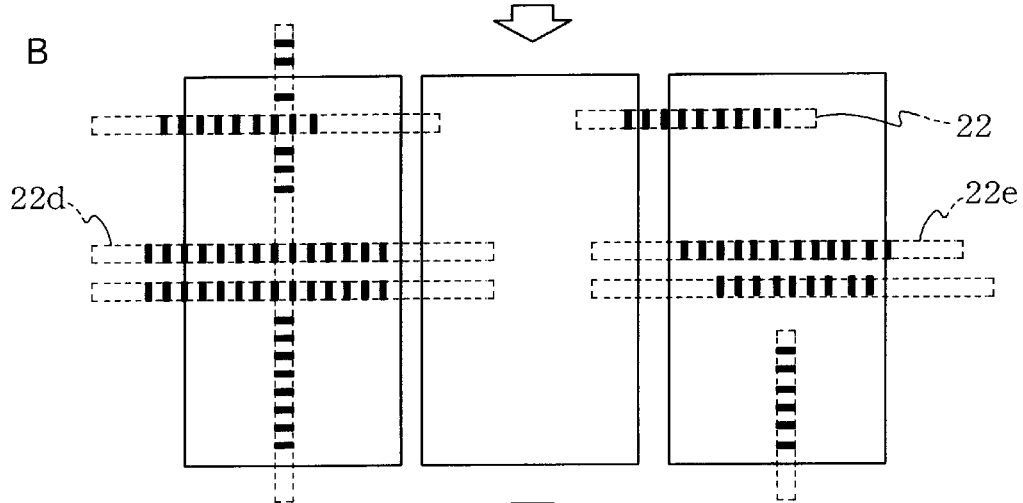
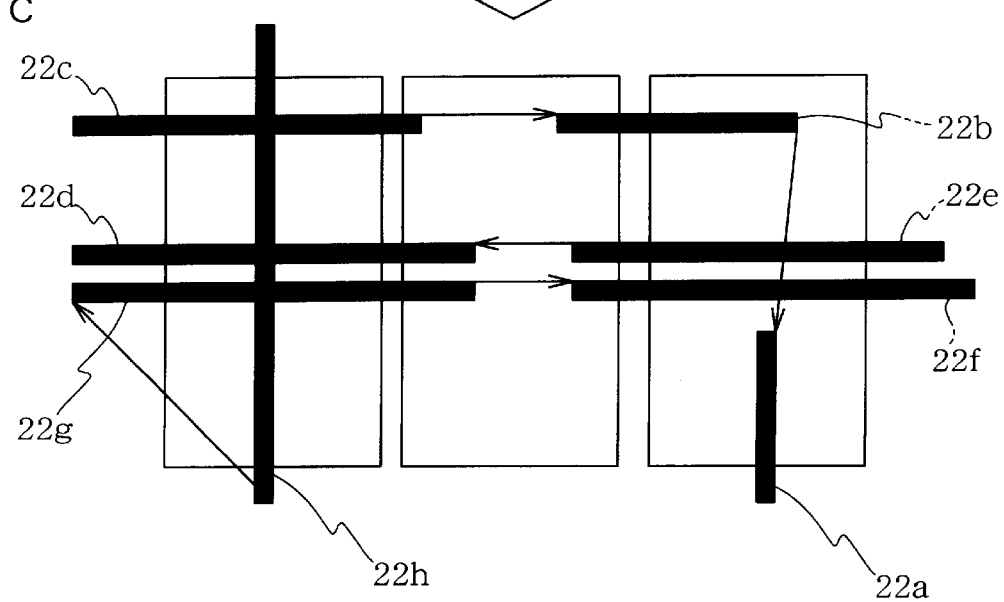

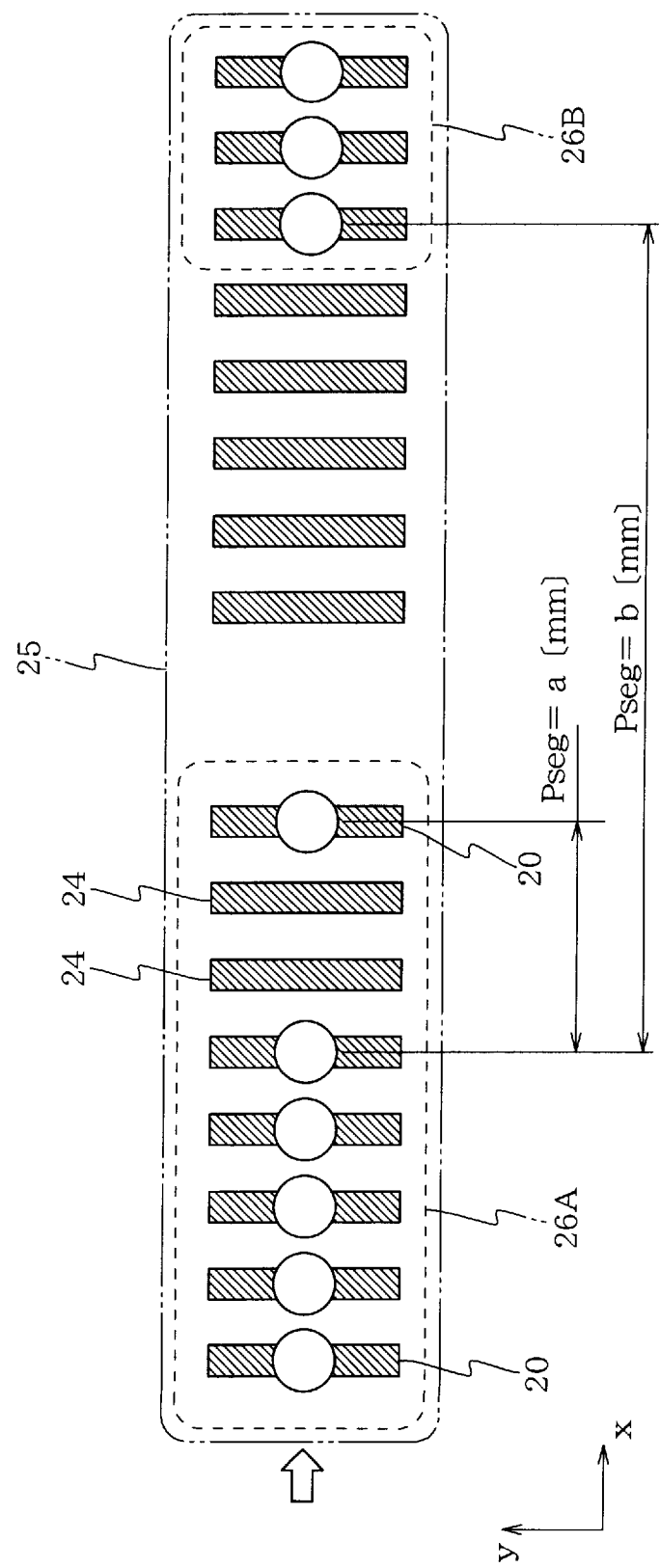

LASER BEAM MACHINING APPARATUS

BACKGROUND OF THE INVENTION

1. Field of the Invention

The present invention relates to a laser beam machining apparatus and in particular, to a laser beam machining apparatus having an improved throughput and an improved machining accuracy.

2. Description of the Related Art

Conventionally, there is a known laser beam machining apparatus called "laser repair" for cutting a fuse for switching an LSI internal wiring or a defective circuit to a redundant circuit, for example, in a DRAM. This laser beam machining apparatus applies a beam focus spot of about 2 micrometers to scan a wafer surface with accuracy in the order of sub-micrometer at a high speed, thus cutting a predetermined position.

Such a laser beam machining apparatus comprises a laser oscillator for emitting a laser beam, and a stage movable in two-dimensional directions of XY with an object such as a wafer mounted thereon. A laser beam emitted from the laser oscillator is focused on the object to be machined (hereinafter, referred to as a workpiece).

The laser beam machining apparatus further comprises a central processing unit (CPU) for performing various controls according to a program, so as to apply a laser beam from the laser oscillator onto a plurality of machining points pre-specified on the workpiece mounted on the stage. In general, positioning of the stage is controlled so that the laser beam is applied to a predetermined machining point on the workpiece.

Conventionally, there has also been an attempt to improve the throughput by accelerating the stage for an interval between machining points.

However, with the rapid technical progress, more and more fine machining is required with an increasing number of machining points.

The laser beam machining apparatus also needs to further increase its machining accuracy and further improve the throughput.

SUMMARY OF THE INVENTION

It is therefore an object of the present invention to provide a laser beam machining apparatus and method enabling to obtain an improved throughput, machining accuracy including a machining position accuracy.

The laser beam machining apparatus according to the present invention comprises: a laser oscillator; a stage for moving a workpiece in XY directions; and a central processing unit (CPU) for controlling laser emission of the laser oscillator and movement of the stage, wherein the CPU causes the laser beam machining apparatus to: group machining points on the workpiece into a plurality of segments, each segment being a set of machining points aligned parallel to one of the X axis and Y axis; create a shortest route through the plurality of segments; drive the stage along the shortest route; and apply a laser beam on the machining points on the shortest route.

In the aforementioned configuration, laser beam machining is performed according to data for the shortest route connecting the machining points. This enables significant improvement of the throughput.

According to another aspect of the present invention, each of the segments is a set of machining points having an identical coordinate value on one of the X and Y axes and being within a predetermined distance from an adjacent machining point on the other axis.

In this configuration, a plurality of machining points having an identical feed direction are grouped into a segment. This eliminates useless movement of the stage, thus increasing the throughput.

According to still another aspect of the present invention, the CPU adds one or more head and tail points to precede and follow each of the segments according to a stage acceleration/deceleration time.

In this configuration, laser beam machining is performed at a constant linear velocity. This enables attainment of laser beam machining with a high accuracy.

According to yet another aspect of the present invention, the CPU further adds one or more head and tail points to precede and follow each of the segments according to a ball bearing screw torque stabilizing time.

In this configuration, the laser beam machining can be performed with a ball bearing screw torque in a stable state. This increases the laser beam machining accuracy.

According to still yet another aspect of the present invention, the CPU further adds one or more head and tail points to precede and follow each of the segments according to a laser output stabilizing time after the laser oscillator is turned on.

In this configuration, the laser beam machining is performed with a laser output power in a stable state. This enhances the laser beam machining accuracy.

According to yet still another aspect of the present invention, the CPU further adds one or more head and tail points to precede and follow each of the segments according to a stage acceleration/deceleration time required until the stage reaches a constant linear velocity and a time required for stabilizing a laser output after the laser oscillator is turned on.

In this configuration, the laser emission timing can be obtained with a predetermined frequency to apply a stable laser beam power. This increases the laser beam machining accuracy.

According to yet another aspect of the present invention, the CPU further adds one or more empty points to precede and follow each of the segments where the laser oscillator emits a laser beam but the laser beam is shaded by a shutter so that the laser beam is not applied onto the workpiece.

In this configuration, the stage is moved (fed) with the least necessary load. This also increases the laser beam machining accuracy.

BRIEF DESCRIPTION OF THE DRAWINGS

FIG. 5 shows a procedure for grouping machining points into segments.

FIG. 6 shows an example of defining a segment.

DESCRIPTION OF THE PREFERRED EMBODIMENTS

Description will now be directed to a laser beam machining apparatus according to an embodiment of the present invention with reference to the attached drawings.

Figure 1:
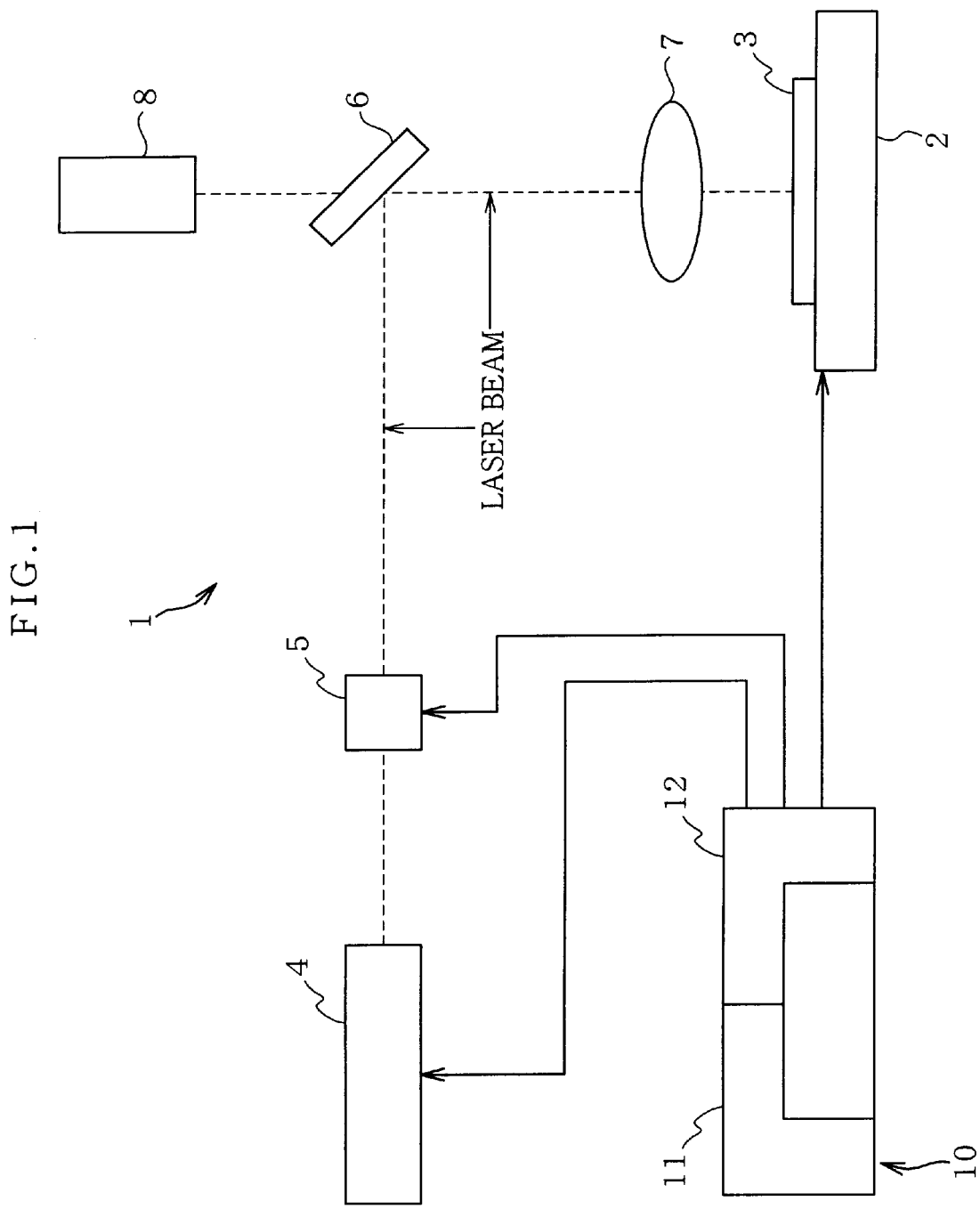
FIG. 1 a laser beam machining apparatus according to an embodiment of the present invention.

FIG. 1 is a block diagram showing configuration of a laser beam machining apparatus according to an embodiment of the present invention.

This laser beam machining apparatus 1 applies a laser beam onto a workpiece 3 mounted on a stage 2 movable in two-dimensional XY directions and performs machining of the workpiece 3.

A laser beam emitted from a laser oscillator 4 passes through an external shutter 5 and is reflected by a half mirror 6 to reach an objective lens 7, which converges the beam onto the workpiece 3.

Moreover, although not depicted in FIG. 1, an illumination light emitted from an illumination light source passes through the half mirror 6 to illuminate the workpiece 3 and the illumination light reflected by the workpiece again passes through the half mirror 6 to be detected by a CCD camera 8, so that a machining state can be observed on a TV monitor (not depicted).

This laser beam machining apparatus 1 includes a central processing apparatus (CPU) 10 such as a computer performing various controls using a program. The CPU 10 has an optimal control data creation function block 11 and a control function block 12 based on an optimized control data. The control function block 12 has a function to perform positioning of the stage 2 by controlling driving of the stage drive motor (not depicted) according to machining position data optimized by the optimal control data creation function block 11 as well as positioning of machining point on the workpiece 3 with respect to the objective lens. Moreover, the control function block 12 can adjust output of the laser oscillator and laser application timing.

Next, explanation will be given regarding processing of the optimal control data creation function block.

The optimal control data creation function block 11 rearranges machining position data items and adds necessary data based on characteristics of the laser beam machining apparatus, thus creating necessary control data.

Figure 2:
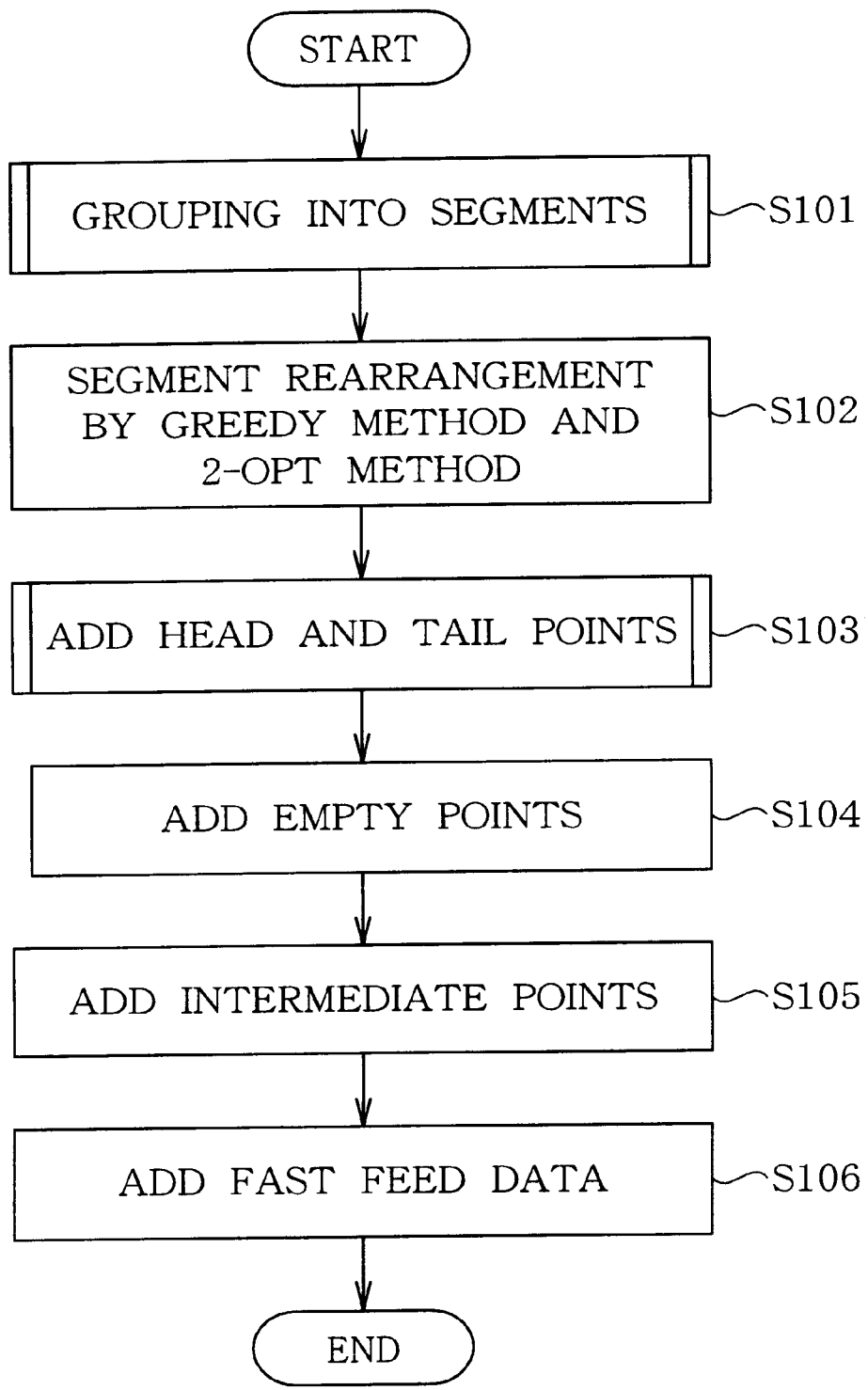
FIG. 2 is a flowchart showing a processing of an optimal control data creation function block of a CPU according to the present invention.

FIG. 2 is a flowchart showing the processing performed by the optimal control data creation function block 11.

Firstly, machining position data stored in memory (not depicted) for a workpiece is read in. The machining position data is divided into "segments", each segment being a set of coordinate data having an identical coordinate value on one axis and being within a predetermined distance from an adjacent machining point. The processing of this grouping into segments will be detailed later.

Next, in step S102, machining position data is rearranged on segment basis. This rearrangement is performed, for example, using the Greedy method or the like wherein start and end data of respective segments are used to determine a routing, starting at a shortest or longest segment so as to obtain a shortest route, and the 2-OPT method or the like wherein two branches are replaced with each other within the routing so as to successively improve the entire routing.

Next, in step S103, one or more head and tail points are added to precede and follow each of the segments according to the characteristics of the stage and other components. That is, it is necessary to consider a time for laser output stabilization after the laser oscillator is turned on and a time required for deceleration after a fast movement between two segments.

Figure 3:
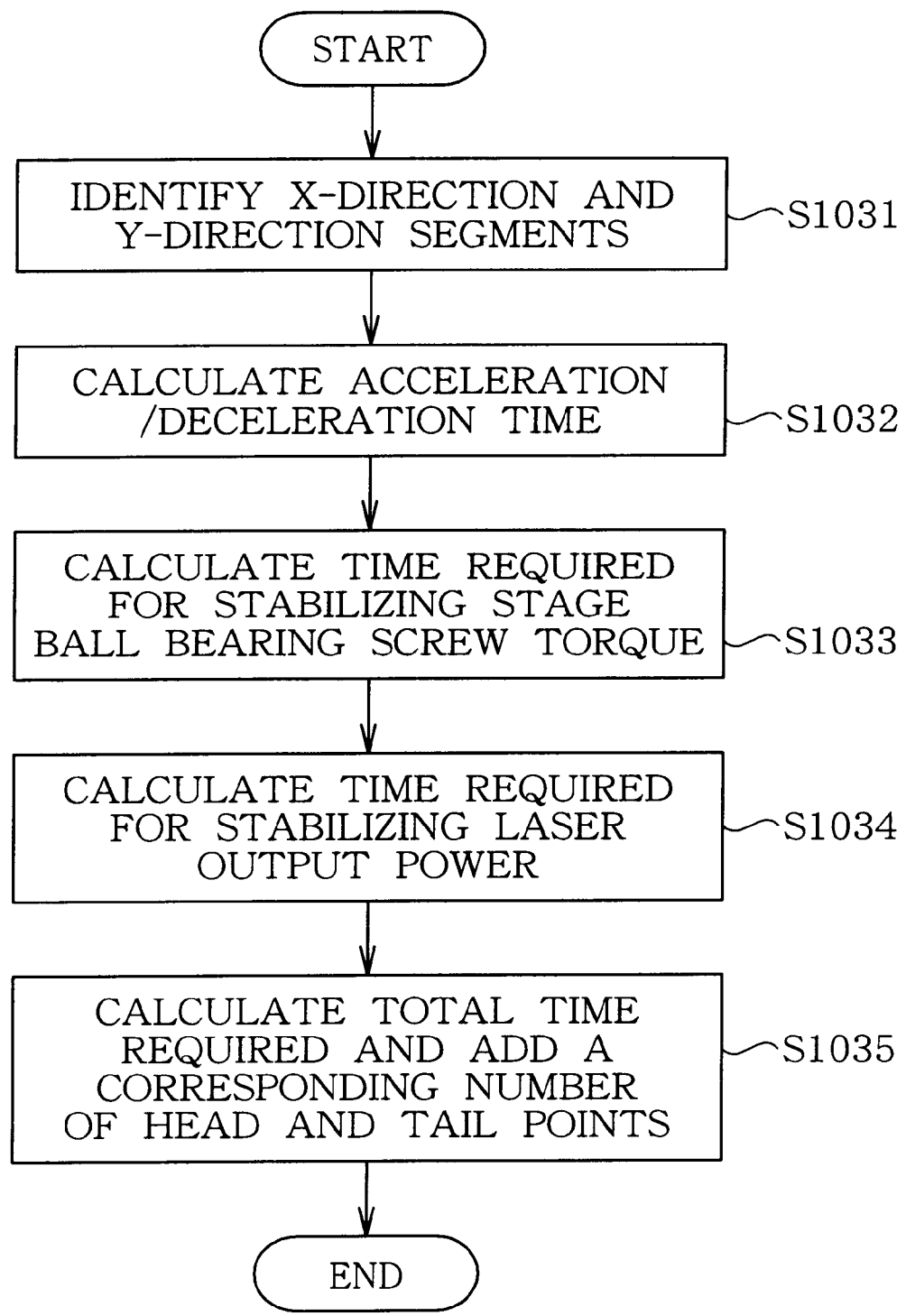
FIG. 3 is a flowchart showing a procedure for adding head and tail points to precede and follow a segment.

The processing of step S103 in FIG. 2 is detailed in FIG. 3.

Firstly, in step S1031, each machining point in a segment is decided to be an X direction point or Y direction point.

Next, in step S1032, the stage acceleration time and deceleration time are calculated so as to obtain a constant linear velocity during a machining period.

Next, step S1033 calculates a time required for stabilizing torque of a ball bearing screw used for transmitting drive of a drive motor (not depicted) to move the stage in the X and Y directions.

Moreover, step S1034 calculates a time required for stabilization of a laser output power after the laser oscillator is turned on.

Finally, step S1035 determines a time required before and after the segment and adds a corresponding number of head and tail points.

Referring back to FIG. 2, in step S104, one or more empty points are added, where the laser oscillator emits a laser beam but the laser beam is shaded by the external shutter so that the laser beam is not applied to the workpiece while the laser power is not stabilized.

Next, in step S105, an intermediate point is added between two adjacent segments on the route by utilizing a spline curve or the like so as to reduce a load on the stage.

Furthermore, step S106 adds a fast feed data so as to move (feed) the stage at a high speed for a long distance such as a distance from a stage starting point to a head of a first point. This completes creation of an optimal control data.

Figure 4:
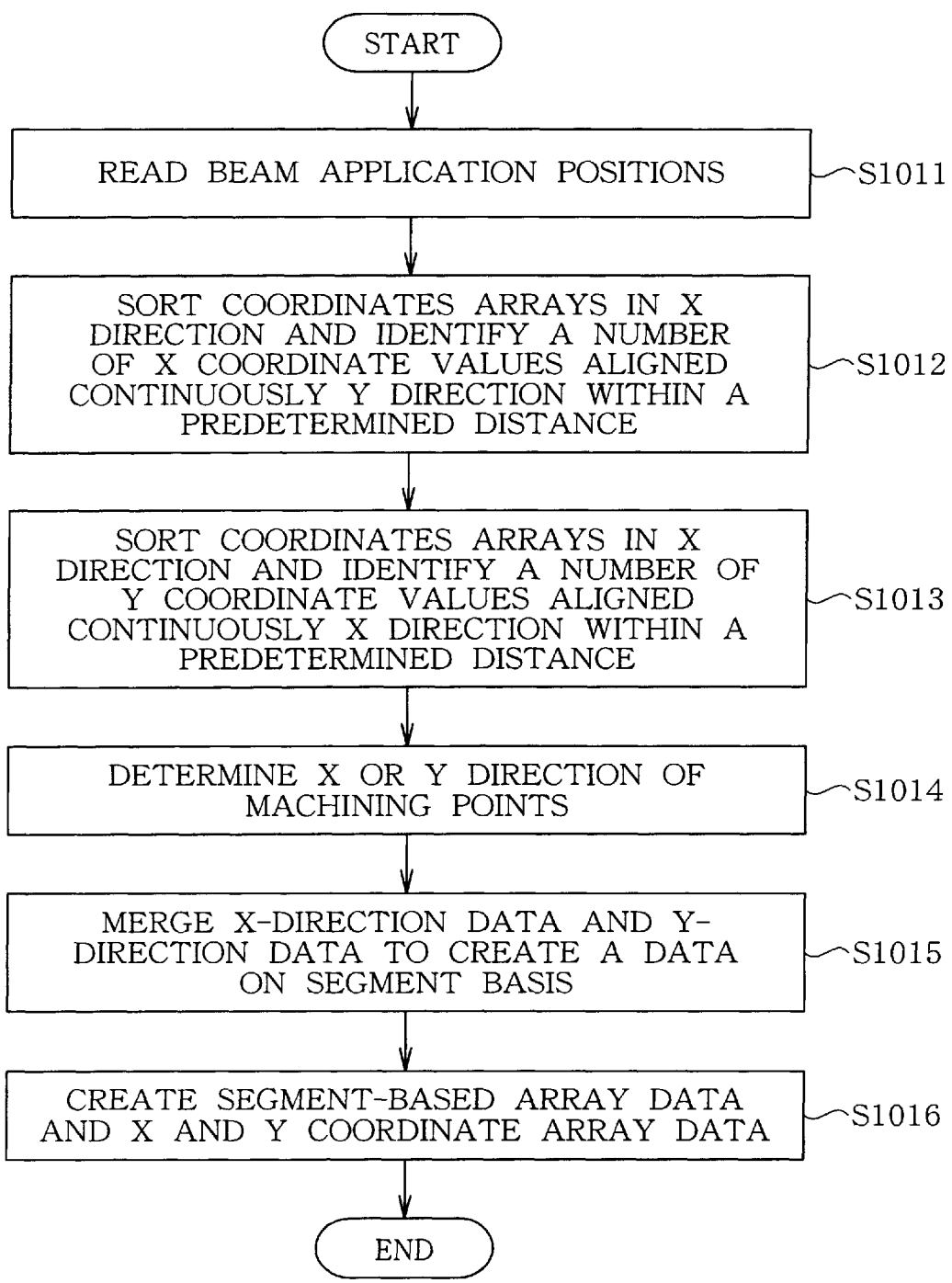
FIG. 4 is a flowchart showing a process for dividing into segments a processing point of the optimal control data creation function block of the CPU of the present invention.

Next, step S101 of FIG. 2 (grouping into segments) will be detailed with reference to a flowchart of FIG. 4.

Firstly, step S1011 reads out X and Y coordinates array data as Xpoint [ ], Ypoint [ ] from memory (not depicted).

Next, step S1012 sorts the coordinates array data in the X direction to create an X-sorted array data Xarray [ ]and identifies a number of identical X coordinate values aligned continuously in the Y axis direction within a predetermined distance.

Furthermore, step S1013 sorts the coordinate array data in the Y direction to create a Y-sorted array data Yarray [ ] and identifies a number of identical Y coordinate values aligned continuously in the X direction within a predetermined distance.

Then, in step S1014, for one machining point position, the number of array data Xarray [ ] aligned in the X direction is compared to array data Yarray [ ] aligned in the Y direction, and the array data having a smaller number is cleared to 0 so as to determine whether the machining point position is in the X direction or Y direction. At this stage, no direction is determined for an independent machining point position having 0 for both of the Xarray [ ] and Yarray [ ].

Step S1015 merges the resultant array data Xarray [ ] and Yarray [ ] to create a segment array data Array [ ] and determine a number of segments.

It should be noted that a data on a each segment head is numbered as 1 to be distinguished from the other data.

Next, step S1016 creates an array data on segment basis SegPoint [ ] and X coordinate and Y coordinate array data XsegPoint [ ] and YsegPoint [ ] indicating a machining point position, thus completing the grouping into segments. It should be noted that an I-th segment data is indicated by 2*I, 2*I+1 with its starting point indicated by XsegPoint [2*I], YsegPoint [2*I] and end point indicated by XsegPoint [2*I+1], YsegPoint [2*I+1]; and its starting point and end point on the segment array data Array indicated by SegPoint [2*I], SegPoint [2*I+1], respectively.

According to the optimal control data thus created by the optimal control data creation function block 11 of the CPU 10, the control function block 12 of the CPU 10 controls the laser oscillator 4, the external shutter 5, and positioning of the stage 2.

Next, referring to FIG. 5 and FIG. 6, a specific example of optimization will be detailed.

As shown in 5A, a plurality of machining points 20 are distributed over three pieces to be machined. Coordinates of these machining points 20 are identified by a set of machining data.

As shown in FIG. 5B, the machining points are grouped into eight segments according to their coordinate values. Each of the segments is a set of machining points having an identical X or Y coordinate value and continuous in the other axis direction.

Here, if a certain discontinuity is allowed in a segment length, the segment parameter Pseg can be defined as a large value "b" as shown by 25 in FIG. 6. Such a large segment is advantageous when the stage is fed at a high speed during a laser oscillation period. On the contrary, two segments can be defined for an identical Y coordinate value when a certain discontinuity in the X direction is present. That is, the segment parameter Pseg can be set to a small value "a". This approach is advantageous for effective acceleration and deceleration during a non-machining period.

For example, in FIG. 5B, segments 22d and 22e have an identical Y coordinate value but they are at a distance exceeding a predetermined value. Accordingly, these segments are defined as separate segments.

In this embodiment, the stage is fed in the X and Y directions and the machining points are grouped into X-direction segments and Y-direction segments. However, if the laser beam machining is performed using a rotary stage, the machining point coordinate data can be divided into a circumferential direction segments.

Next, one or more head points and tail points are added to precede and follow each of the segments. In FIG. 5B, each of the segments has regions indicated by a dotted line. These are the head and tail points or empty points. The number of the head and tail points are determined according to the time required for acceleration/deceleration for the stage feed velocity and the time required for stabilizing the laser output power. At the empty points, the laser beam is emitted but shaded by the external shutter.

Next, a shortest routing is determined to pass through all the segments. In FIG. 5C, segment 22h is the longest among the segments, and the route starts from this segment 22h. The segment coordinate data are repeatedly rearranged until the shortest route indicated by arrows in FIG. 5C is found.

After this, an intermediate point is added between two adjacent segments, thus completing the optimization.

The aforementioned procedure is performed by the CPU executing a laser beam machining route optimization program. The CPU executing this program has the optimal control data creation function including respective necessary means for executing the processing of FIG. 2 to FIG. 4.

In the aforementioned laser beam machining apparatus, machining points are grouped into segments in step 101, after which rearrangement is performed on segment basis in step S102. Furthermore, in step 106, fast feed data is added, thus creating data for the shortest routing through the machining points. This optimal control data is used to control the stage movement. This enables attainment of a high-speed machining and improvement of the throughput.

Moreover, step S1034 calculates the time for stabilization of the laser output power at a laser beam emission start; step S1032 performs calculations to obtain a constant linear velocity of the stage during a machining period; and step S104 adds empty points so that a beam emission timing can be obtained with a constant frequency. This results in improvement of the machining accuracy in the machining process of a workpiece.

Furthermore, step s1032 calculates the time required for acceleration and deceleration so as to obtain a constant linear velocity during a beam emission period; step S1033 calculates the time for stabilization of the ball bearing screw torque; and step S105 adds intermediate points. Accordingly, it is possible to further enhance the machining accuracy.

In the aforementioned embodiment, the stage is positioned so that a machining point of the workpiece is on the optical axis of the objective lens. However, it is also possible to position the laser spot instead of moving the stage, or to employ both of the stage positioning and the laser spot positioning.

As has thus far been described, in the laser beam machining apparatus according to the present invention, the optimal control data creation function of the CPU creates an optimal (optimized) control data, based on various characteristics of the stage and other control devices and laser machining is controlled according to the optimal control data created. This enables to improve the throughput and the machining accuracy including the machining position accuracy.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 10-089091 (Filed on Apr. $1^{st}$, 1998) including specification, claims, drawings and summary are incorporated herein by reference in its entirety.

What is claimed is:

1. A laser beam machining apparatus comprising:
    a laser oscillator;
    a stage for moving a workpiece in XY directions; and
    a central processing unit (CPU) for controlling laser emission of the laser oscillator and movement of the stage,
    wherein the CPU causes the laser beam machining apparatus to:
        group machining points on the workpiece into a plurality of segments, each segment comprising a set of machining points aligned parallel to one of the X axis and Y axis;
        create a shortest route through the plurality of segments;
        drive the stage along the shortest route; and
        apply a laser beam to the workpiece only on the machining points on the shortest route.
2. A laser beam machining apparatus as claimed in claim 1, wherein each of the segments comprises a set of machining points having an identical coordinate value on one of the X and Y axes and being within a predetermined distance from an adjacent machining point on the other axis.
3. A laser beam machining apparatus as claimed in claim 1, wherein the CPU adds one or more head and tail points to precede and follow each of the segments according to a stage acceleration/deceleration time.

4. A laser beam machining apparatus as claimed in claim 1, wherein the CPU further adds one or more head and tail points to precede and follow each of the segments according to a ball bearing screw torque stabilizing time.

5. A laser beam machining apparatus as claimed in claim 1, wherein the CPU further adds one or more head and tail points to precede and follow each of the segments according to a laser output stabilizing time after the laser oscillator is turned on.

6. A laser beam machining apparatus as claimed in claim 1, wherein the CPU further adds one or more head and tail points to precede and follow each of the segments according to a stage acceleration/deceleration time required until the stage reaches a constant linear velocity and a time required for stabilizing a laser output after the laser oscillator is turned on.

7. A laser beam machining apparatus as claimed in claim 1, wherein the CPU further adds one or more empty points to precede and follow each of the segments where the laser oscillator emits a laser beam but the laser beam is shaded by a shutter so that the laser beam is not applied onto the workpiece.

8. A laser beam machining apparatus as claimed in claim 1, wherein the CPU further adds an intermediate point utilizing a spline curve or the like between each final point of a segment and a head of a following segment.

9. A laser beam machining apparatus as claimed in claim 1, wherein the CPU further adds a fast feed data so as to move the stage at a high speed for a long distance.

10. A laser beam machining apparatus comprising:
   a laser oscillator;
   a stage for moving a workpiece in XY directions; and
   a central processing unit (CPU) for controlling laser emission of the laser oscillator and movement of the stage, the CPU including:
      means for grouping machining points on the workpiece into a plurality of segments, each segment comprising a set of machining points aligned parallel to one of the X axis and Y axis;
      means for creating a shortest route through the plurality of segments;
      means for driving the stage along the shortest route; and
      means for applying a laser beam to the workpiece only on the machining points on the shortest route.

11. A laser beam machining apparatus as claimed in claim 10, wherein each of the segments comprises a set of machining points having an identical coordinate value on one of the X and Y axes and being within a predetermined distance from an adjacent machining point on the other axis.

12. A laser beam machining apparatus as claimed in claim 10, wherein the CPU further adds one or more head and tail points to precede and follow each of the segments according to a stage acceleration/deceleration time required until the stage reaches a constant linear velocity and a time required for stabilizing a laser output after the laser oscillator is turned on.

13. A laser beam machining method using a laser beam machining apparatus comprising: a laser oscillator; a stage for moving a workpiece in XY directions; and a central processing unit (CPU) for controlling laser emission of the laser oscillator and movement of the stage, said method comprising steps of:
   grouping machining points on the workpiece into a plurality of segments, each segment comprising a set of machining points aligned parallel to one of the X axis and Y axis;
   creating a shortest route through the plurality of segments;
   driving the stage along the shortest route; and
   applying a laser beam to the workpiece only on the machining points on the shortest route.

14. A laser beam machining method as claimed in claim 13, wherein each of the segments comprises a set of machining points having an identical coordinate value on one of the X and Y axes and being within a predetermined distance from an adjacent machining point on the other axis.

15. A laser beam machining method as claimed in claim 13, wherein the CPU further adds one or more head and tail points to precede and follow each of the segments according to a stage acceleration/deceleration time required until the stage reaches a constant linear velocity and a time required for stabilizing a laser output after the laser oscillator is turned on.

16. A computer program product stored on a storage medium for controlling a laser beam machining apparatus, the apparatus comprising: a laser oscillator; a stage for moving a workpiece in XY directions; and a processor for controlling laser emission of the laser oscillator and movement of the stage, the program causing the apparatus to:
   group machining points on the workpiece into a plurality of segments, each segment comprising a set of machining points aligned parallel to one of the X axis and Y axis;
   create a shortest route through the plurality of segments;
   drive the stage along the shortest route; and
   apply a laser beam to the workpiece only on the machining points on the shortest route.

17. A computer program product as claimed in claim 16, wherein the program causes the processor to add one or more head and tail points to precede and follow each of the segments according to a stage acceleration/deceleration time required until the stage reaches a constant linear velocity and a time required for stabilizing a laser output after the laser oscillator is turned on.

* * * * *